(12) United States Patent
Oya et al.

(10) Patent No.: US 10,825,971 B2
(45) Date of Patent: Nov. 3, 2020

(54) LIGHT-EMITTING DEVICE INCLUDING A DISTRIBUTED BRAGG REFLECTOR (DBR) FILM

(71) Applicant: TOYODA GOSEI CO., LTD., Kiyosu-shi (JP)

(72) Inventors: Masaki Oya, Kiyosu (JP); Takashi Mizobuchi, Kiyosu (JP)

(73) Assignee: TOYODA GOSEI CO., LTD., Kiyosu (JP)

( * ) Notice: Subject to any disclaimer, the term of this patent is extended or adjusted under 35 U.S.C. 154(b) by 0 days.

(21) Appl. No.: 16/197,729

(22) Filed: Nov. 21, 2018

(65) Prior Publication Data
US 2019/0165227 A1    May 30, 2019

(30) Foreign Application Priority Data
Nov. 24, 2017    (JP) .................................. 2017-226256

(51) Int. Cl.
*H01L 33/60* (2010.01)
*H01L 33/46* (2010.01)
*H01L 33/10* (2010.01)

(52) U.S. Cl.
CPC .............. *H01L 33/60* (2013.01); *H01L 33/46* (2013.01); *H01L 33/10* (2013.01); *H01L 33/105* (2013.01); *H01L 2933/0058* (2013.01)

(58) Field of Classification Search
CPC ......... H01L 33/60; H01L 33/46; H01L 33/10; H01L 33/105
See application file for complete search history.

(56) References Cited

U.S. PATENT DOCUMENTS

| | | | | | |
|---|---|---|---|---|---|
| 4,785,338 | A | * | 11/1988 | Kinoshita | ........... H01L 31/0203 257/434 |
| 7,101,061 | B2 | * | 9/2006 | Nagai | ........................ F21K 9/00 257/E25.02 |
| 8,134,166 | B2 | * | 3/2012 | Imai | ........................ F21V 5/005 257/89 |
| 8,446,446 | B2 | * | 5/2013 | Hoshi | .................. H01S 5/02296 347/238 |
| 8,449,973 | B2 | * | 5/2013 | Katabe | .................. G02B 5/0221 428/304.4 |
| 8,629,476 | B2 | * | 1/2014 | Inoguchi | ............. H01L 25/0753 257/98 |
| 8,803,936 | B2 | * | 8/2014 | Adachi | ...................... B41J 2/45 347/238 |

(Continued)

FOREIGN PATENT DOCUMENTS

JP    2017-073549 A    4/2017

*Primary Examiner* — Ida M Soward
(74) *Attorney, Agent, or Firm* — McGinn I.P. Law Group, PLLC.

(57) ABSTRACT

A light-emitting device includes a light-emitting element mounted on a base substrate, a reflective member that is formed on the base substrate and surrounds the light-emitting element, a transparent member that has a flat upper surface and is placed to cover above the light-emitting element, and a DBR film placed on the upper surface of the transparent member. A relation between an incident angle of light emitted from the light-emitting element and input into the DBR film and a transmittance of the light to pass through the DBR film is obtained such that a peak of the transmittance is in a range of the incident angle greater than 0°.

16 Claims, 12 Drawing Sheets

(56) References Cited

U.S. PATENT DOCUMENTS

| | | | | |
|---|---|---|---|---|
| 9,653,663 B2* | 5/2017 | Yan | ..................... | H01L 25/0753 |
| 9,831,633 B2* | 11/2017 | Ishii | ........................... | B41J 2/47 |
| 9,966,514 B2* | 5/2018 | Hsu | ........................ | H01L 33/62 |
| 10,122,147 B2* | 11/2018 | Tanisaka | ............. | H01S 5/02252 |
| 10,274,168 B2* | 4/2019 | Tamura | ..................... | F21V 3/02 |
| 10,276,743 B2* | 4/2019 | Jung | ........................ | H01L 33/44 |
| 10,297,725 B2* | 5/2019 | Kim | ........................ | H01L 33/56 |
| 10,529,898 B2* | 1/2020 | Han | ........................ | H01L 33/387 |
| 10,644,209 B2* | 5/2020 | Hsieh | ..................... | H01L 33/486 |
| 2010/0006871 A1* | 1/2010 | Imai | ........................ | F21V 5/005 |
| | | | | 257/89 |
| 2013/0193464 A1* | 8/2013 | Bae | ........................ | H01L 33/486 |
| | | | | 257/94 |
| 2014/0061704 A1* | 3/2014 | Yamada | ................... | H01L 33/62 |
| | | | | 257/98 |
| 2014/0339588 A1* | 11/2014 | Park | ........................ | H01L 33/50 |
| | | | | 257/98 |
| 2015/0129919 A1* | 5/2015 | Liu | ........................ | H01L 33/54 |
| | | | | 257/98 |
| 2015/0188011 A1* | 7/2015 | Kang | ..................... | H01L 33/60 |
| | | | | 257/98 |
| 2016/0126435 A1* | 5/2016 | Akaishi | ................... | H01L 33/62 |
| | | | | 257/98 |
| 2017/0103972 A1 | 4/2017 | Yamada et al. | | |
| 2018/0019384 A1* | 1/2018 | Abe | ........................ | G02B 5/285 |
| 2018/0131160 A1* | 5/2018 | Zhang | ................... | H01S 5/0622 |
| 2019/0081216 A1* | 3/2019 | Shi | ........................ | H01L 33/483 |
| 2019/0081221 A1* | 3/2019 | Jeon | ........................ | H01L 33/62 |
| 2019/0088824 A1* | 3/2019 | Kim | ........................ | H01L 33/56 |
| 2019/0334063 A1* | 10/2019 | Kim | ........................ | H01L 33/48 |
| 2019/0371987 A1* | 12/2019 | Perkins | ................... | H01L 33/42 |
| 2020/0020836 A1* | 1/2020 | Nishioka | ................ | H01L 33/60 |
| 2020/0274027 A1* | 8/2020 | Huang | ................... | H01L 33/10 |

* cited by examiner

LIGHT-EMITTING DEVICE INCLUDING A DISTRIBUTED BRAGG REFLECTOR (DBR) FILM

CROSS-REFERENCE TO RELATED APPLICATIONS

The present application is based on Japanese patent application No. 2017-226256 filed on Nov. 24, 2017, the entire contents of which are incorporated herein by reference.

BACKGROUND OF THE INVENTION

1. Field of the Invention

The invention relates to a light-emitting device.

2. Description of the Related Art

A light-emitting device is known which has so-called batwing light distribution characteristics such that a luminous intensity (i.e., an axial luminous intensity) in a direction with a light distribution angle of 0° is low and luminous intensity in a direction (generally a direction with an angle of around ±60°) with a large light distribution angle is high (see, e.g., JP 2017/73549 A). The light-emitting device described in JP 2017/73549 A uses a light-reflective film provided on an upper surface of a light-emitting element and a sealing member covering the light-emitting element as well as the light-reflective film, and thereby realizes batwing light distribution characteristics without using a secondary lens. This allows significant downsizing of the sealing member.

SUMMARY OF THE INVENTION

The light-emitting device described in JP 2017/73549 A may have a drawback that it has a relatively high axial luminous intensity.

It is an object of the invention to provide a light-emitting device that has a structure to allow downsizing thereof and ideal batwing light distribution characteristics with a low axial luminous intensity.

According to an embodiment of the invention, a light-emitting device defined by [1] to [8] below is provided.

[1] A light-emitting device, comprising: a light-emitting element mounted on a base substrate; a reflective member that is formed on the base substrate and surrounds the light-emitting element; a transparent member that has a flat upper surface and is placed to cover above the light-emitting element; and a DBR film placed on the upper surface of the transparent member, wherein a relation between an incident angle of light emitted from the light-emitting element and input into the DBR film and a transmittance of the light to pass through the DBR film is obtained such that a peak of the transmittance is in a range of the incident angle greater than 0°.

[2] The light-emitting device according to [1], wherein the transparent member comprises a first portion covering the upper surface of the light-emitting element and a second portion having a plate shape and placed on the upper surface of the first portion and the upper surface of the reflective member, and wherein the reflective member covers side surfaces of the light-emitting element and side surfaces of the first portion.

[3] The light-emitting device according to [1] or [2], wherein a relation between a light distribution angle and an emission intensity is obtained such that the emission intensity at a light distribution angle of 0° is not more than 10% of a peak of the emission intensity.

[4] The light-emitting device according to any one of [1] to [3], wherein all side surfaces of the transparent member are covered with the reflective member.

[5] The light-emitting device according to any one of [1] to [4], wherein an inner side surface of the reflective member is inclined so that a space inside the reflective member is widened upward, and wherein the transparent member fills the space inside the reflective member and covers the upper and side surfaces of the light-emitting element.

[6] The light-emitting device according to any one of [1] to [5], wherein the inner side surface of the reflective member comprises a first inclined surface inclined at a first angle with respect to the upper surface of the base substrate and a second inclined surface inclined at a second angle with respect to the upper surface of the base substrate and located on the upper side of the first inclined surface, the second angle being smaller than the first angle.

[7] The light-emitting device according to any one of [1] to [6], wherein the inner side surface of the reflective member comprises an inverted truncated cone-shaped side surface.

[8] The light-emitting device according to any one of [1] to [7], wherein a relation between a light distribution angle and an emission intensity is obtained such that the emission intensity at a light distribution angle of 0° is not more than 5% of a peak of the emission intensity.

Effects of the Invention

According to an embodiment of the invention, a light-emitting device can be provided that has a structure to allow downsizing thereof and ideal batwing light distribution characteristics with a reduced leakage in a lateral direction.

BRIEF DESCRIPTION OF THE DRAWINGS

Next, the present invention will be explained in more detail in conjunction with appended drawings, wherein.

DESCRIPTION OF THE PREFERRED EMBODIMENTS

First Embodiment

Configuration of a Light-Emitting Device

Figure 1:
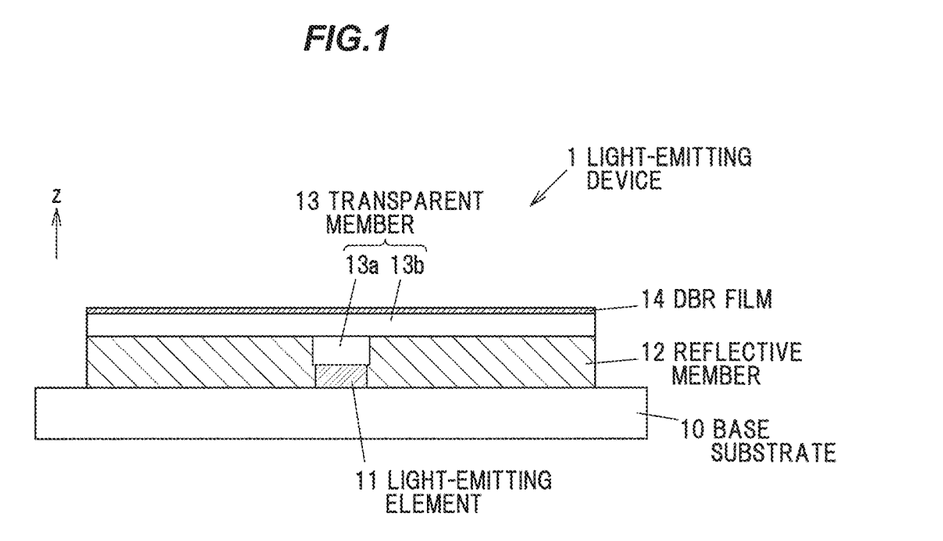
FIG. 1 is a vertical cross-sectional view showing a light-emitting device in the first embodiment.

FIG. 1 is a vertical cross-sectional view showing a light-emitting device 1 in the first embodiment. The light-emitting device 1 is provided with a base substrate 10, a light-emitting element 11 mounted on the base substrate 10, a reflective member 12 which is formed on the base substrate 10 and surrounds the light-emitting element 11, a transparent member 13 which has a flat upper surface and is placed to cover above the light-emitting element 11, and a DBR (Distributed Bragg Reflector) film 14 placed on the upper surface of the transparent member 13.

The base substrate 10 is, e.g., a ceramic substrate such as $Al_2O_3$ substrate or AlN substrate, a metal substrate such as Al substrate or Cu substrate of which surface is covered with an insulating film, or a glass-epoxy substrate. The AlN substrate has excellent heat dissipation properties and is thus particularly preferable as the base substrate 10.

The light-emitting element 11 is typically an LED chip but may be another light-emitting element such as laser diode chip. In addition, the light-emitting element 11 is typically a flip-chip element but may be a face-up element. The light-emitting element 11 is connected to a wiring (not shown) provided on an upper surface of the base substrate 10. The emission wavelength of the light-emitting element 11 is not specifically limited, and can be, e.g., blue wavelength (440 to 460 nm) suitable for obtaining white color since batwing light distribution of the light-emitting device 1 is suitable for liquid-crystal backlight.

The transparent member 13 has a first portion 13a covering the upper surface of the light-emitting element 11, and a second portion 13b having a plate shape and placed on the upper surface of the first portion 13a and the upper surface of the reflective member 12. The transparent member 13 is typically formed of a resin such as silicone-based resin or epoxy-based resin, but may be formed of another transparent material such as glass.

The transparent member 13 may be configured such that one or both of the first portion 13a and the second portion 13b contain a phosphor which is excited by light emitted from the light-emitting element 11 and emits fluorescence. In this case, the DBR film 14 is designed by taking into account both the emission wavelength of the light-emitting element 11 and the fluorescence wavelength of the phosphor.

The reflective member 12 covers side surfaces of the light-emitting element 11 and side surfaces of the first portion 13a of the transparent member 13. The reflective member 12 is a white member which is formed mainly of a resin such as silicone-based resin or epoxy-based resin, or a glass, etc., and contains white pigment such as titanium dioxide. Alternatively, a highly-reflective material such as AlN may be used as the material of the reflective member 12.

The DBR film 14 is, e.g., a multilayer film formed of a dielectric such as $SiO_2$ or $TiO_2$. Transmittance of light emitted from the light-emitting element 11 and incident on the DBR film 14, which realizes batwing light distribution characteristics (described later) of the light-emitting device 1, depends on an angle of incidence of light on the DBR film 14. In other words, in a relation between an incident angle of light, which is emitted from the light-emitting element 11 and incident on the DBR film 14, and transmittance through the DBR film 14, a transmittance peak exists in a range where the incident angle is greater than 0°. The transmittance at 0° is preferably not more than 20%, more preferably not more than 10%, of the peak transmittance.

Figure 2:
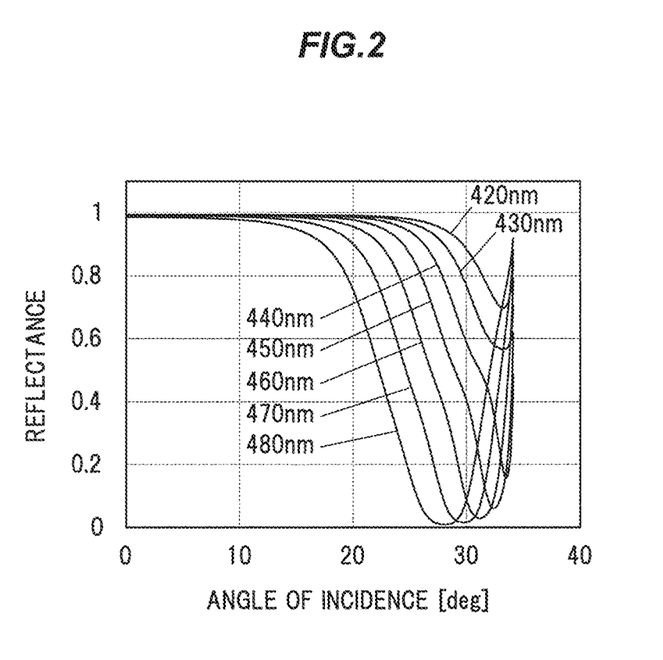
FIG. 2 is a graph showing an example of reflection/transmission characteristics of a DBR film in the first embodiment.

FIG. 2 is a graph showing an example of reflection/transmission characteristics of the DBR film 14. In the example shown in FIG. 2, the peak of transmittance of light at 420 to 480 nm exists in a range where the absolute value of the incident angle is about not less than 25° and not more than 45°.

Figure 3A:
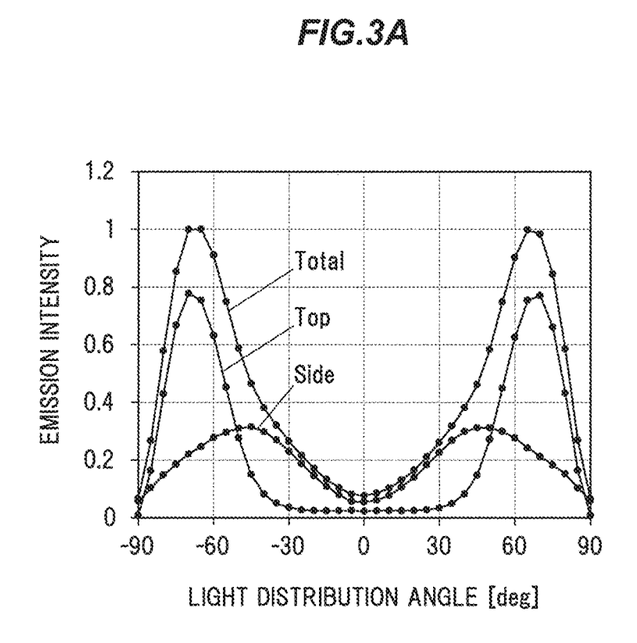
FIG. 3A is a graph showing a relation between light distribution angle and emission intensity of the light-emitting device in the first embodiment.

FIG. 3A is a graph showing a relation between light distribution angle and emission intensity of the light-emitting device 1. The light distribution angle is an angle relative to an axial direction (height direction, normal direction) z of the light-emitting device 1 in a plane including the axial direction z. Thus, the light distribution angle in the axial direction z is 0° and the light distribution angle in a direction orthogonal to the axial direction z is 90° in absolute value.

"Top" in FIG. 3A shows light distribution characteristics of light extracted upward from the light-emitting device 1 via the DBR film 14, and "Side" shows light distribution characteristics of light extracted laterally from the light-emitting device 1 without passing through the DBR film 14. "Total" is overall light distribution characteristics of the light-emitting device 1 as a combination of "Top" and "Side".

Figure 4:
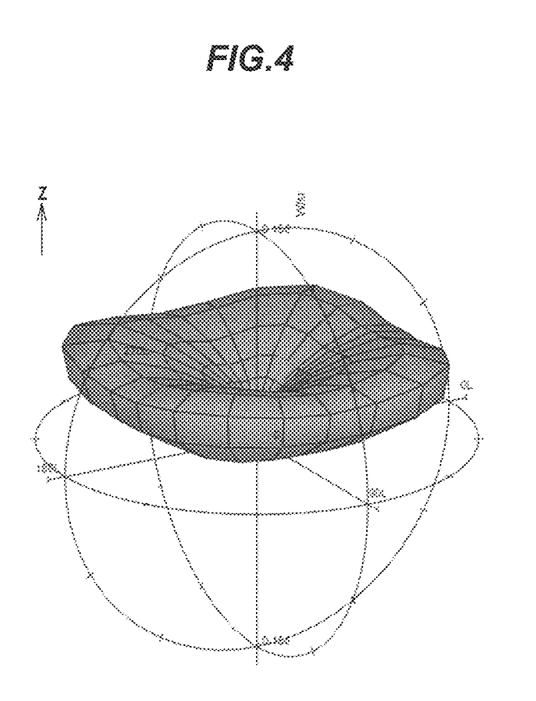
FIG. 4 is a diagram three-dimensionally illustrating a relation between light distribution angle and emission intensity of the light-emitting device in the first embodiment.

FIG. 4 is a diagram three-dimensionally illustrating a relation between light distribution angle and emission intensity (corresponding to "Total" in FIG. 3A) of the light-emitting device 1. The origin of the coordinates showing the light distribution angle in FIG. 4 is the center of a light extraction surface of the light-emitting device 1 (the center of the upper surface of the DBR film 14).

As shown in FIGS. 3A and 4, the light-emitting device 1 has light distribution characteristics, so-called batwing distribution, in which emission intensity in the axial direction z is low and the emission intensity is peaked on the sides with large angle. In detail, in the relation between the light distribution angle and the emission intensity, the emission intensity peak exists in a range where the absolute value of the light distribution angle is greater than 0°. The emission intensity at 0° is preferably as low as possible, and is preferably, e.g., not more than 20%, more preferably not more than 10%, of the emission intensity at the peak (the peak emission intensity).

In the example shown in FIG. 3A, the emission intensity of "Total" in a direction with a light distribution angle of 0° is 7.8% of the peak emission intensity. As such, in the light-emitting device 1 of the first embodiment, the emission intensity in a direction with a light distribution angle of 0° can be kept down to not more than 10% of the peak emission intensity. The emission intensity in a direction with a light distribution angle of 0° is kept down so low because not only light emitted from the upper surface of the light-emitting element 11 but also substantially all the light emitted from the side surfaces of the light-emitting element 11 are extracted through the DBR film 14.

In the relation between the light distribution angle and the emission intensity, the emission intensity at a light distribution angle of 90° in absolute value is also kept down low. The emission intensity in a direction with a light distribution angle of 90° in absolute value is kept down so low because only light which propagates in the transparent member 13 and slightly leaks out from the second portion 13b is the light extracted without passing through the DBR film 14.

Figure 3B:
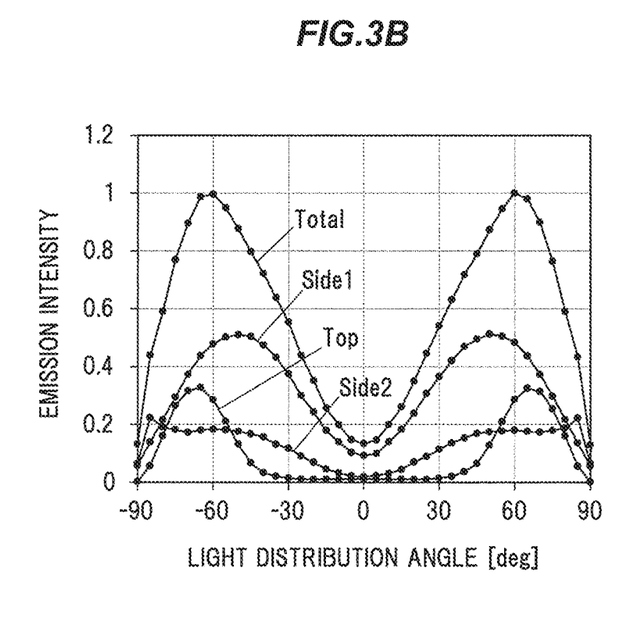
FIG. 3B is a graph showing a relation between light distribution angle and emission intensity of a light-emitting device as Comparative Example in which a reflective member is not provided and light emitted laterally from the light-emitting element is extracted directly.

FIG. 3B is a graph showing a relation between light distribution angle and emission intensity of a light-emitting device as Comparative Example in which the reflective member 12 is not provided, the DBR film 14 is directly adhered to the upper surface of the light-emitting element 11, and light emitted laterally from the light-emitting element 11 is extracted without passing through the DBR film 14.

"Top" shows light distribution characteristics of light extracted upward from the light-emitting device 1 via the DBR film 14, "Side 1" shows light distribution characteristics of light emitted laterally from a chip substrate of the flip-chip mounted light-emitting element 11 and extracted laterally from the light-emitting device 1 without passing through the DBR film 14, and "Side 2" shows light distribution characteristics of light emitted laterally from a light-emitting layer located under the chip substrate in the light-emitting element 11 and extracted laterally from the light-emitting device 1 without passing through the DBR film 14. "Total" is overall light distribution characteristics as a combination of "Top", "Side 1" and "Side 2".

The emission intensity in a direction with a light distribution angle of 0° with respect to the peak emission intensity is larger in the light-emitting device of Comparative Example than in the light-emitting device 1 of the first embodiment. This is due to components with low light distribution angle contained in light which is emitted laterally from the light-emitting element 11, is extracted directly without passing through the DBR film 14, and has a Lambertian light distribution.

Even in the light-emitting device 1 of the first embodiment, the amount of light emitted from the side surfaces of the second portion 13b and extracted laterally from the light-emitting device 1 without passing through the DBR film 14 increases when the second portion 13b of the transparent member 13 has a too large thickness relative to its area, causing an increase in the emission intensity in a direction with a light distribution angle of 0° with respective to the peak emission intensity of the light-emitting device 1. Thus, to obtain intended light distribution characteristics, the thickness of the second portion 13b of the transparent member 13 relative to its area is determined so that the emission intensity in a direction with a light distribution angle of 0° is, e.g., not more than 20%, more preferably not more than 10%, of the peak emission intensity.

Method for Manufacturing the Light-Emitting Device

FIGS. 5A to 5D are vertical cross-sectional views showing an example of a process for manufacturing the light-emitting device 1 in the first embodiment.

Figure 5A:
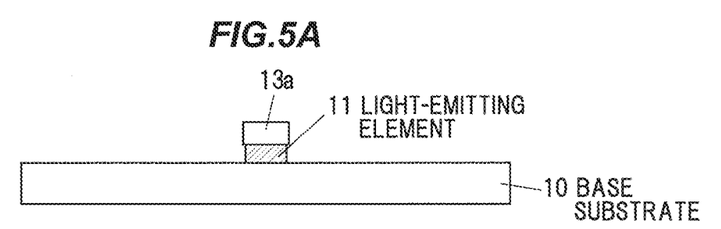
FIGS. 5A to 5D are vertical cross-sectional views showing an example of a process for manufacturing the light-emitting device in the first embodiment.

Firstly, as shown in FIG. 5A, the first portion 13a of the transparent member 13 is placed on the upper surface, as a light extraction surface, of the light-emitting element 11 mounted on the base substrate 10. The first portion 13a can be formed by, e.g., dicing a sheet-shaped resin, such as silicone-based resin or epoxy-based resin, into a piece having the same shape as the light-emitting element 11.

Figure 5B:
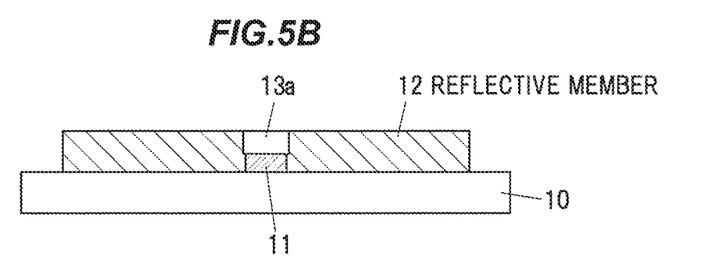

Next, as shown in FIG. 5B, the reflective member 12 is formed so that the side surfaces of the light-emitting element 11 and the side surfaces of the first portion 13a of the transparent member 13 are covered. The reflective member 12 can be formed by, e.g., molding a resin, such as silicone-based resin or epoxy-based resin, containing white pigment such as titanium dioxide, using a drop method.

Figure 5C:
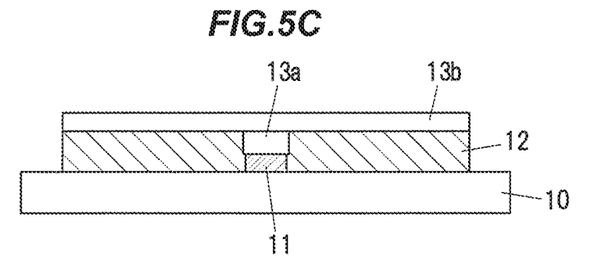

Next, as shown in FIG. 5C, the second portion 13b having a plate shape is formed on the upper surface of the first portion 13a and the upper surface of the reflective member 12. The second portion 13b can be formed by, e.g., applying a resin such as silicone-based resin or epoxy-based resin using a squeegee, etc. At this stage, the upper surface of the second portion 13b is preferably flattened by polishing using a grinder, etc., so that the DBR film 14 can be flatly placed in tight contact with the upper surface of the second portion 13b.

Figure 5D:
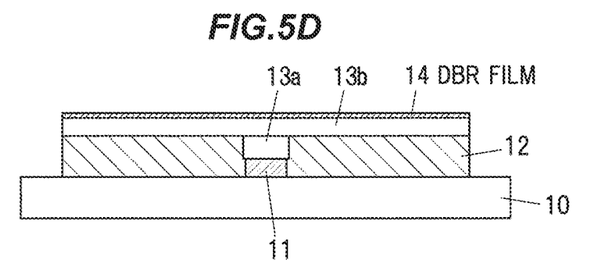

Next, as shown in FIG. 5D, the DBR film 14 is placed on the flat upper surface of the second portion 13b of the transparent member 13. The DBR film 14 can be formed by, e.g., alternately depositing thin films of $TiO_2$ and $SiO_2$.

Since each constructional element does not have a complicated shape, the light-emitting device 1 in the first embodiment is excellent in terms of ease of manufacturing.

Second Embodiment

The second embodiment is different from the first embodiment in the shapes of the transparent member and the reflective member. The explanation of the same features as those in the first embodiment will be omitted or simplified.

Configuration of a Light-Emitting Device

Figure 6A:
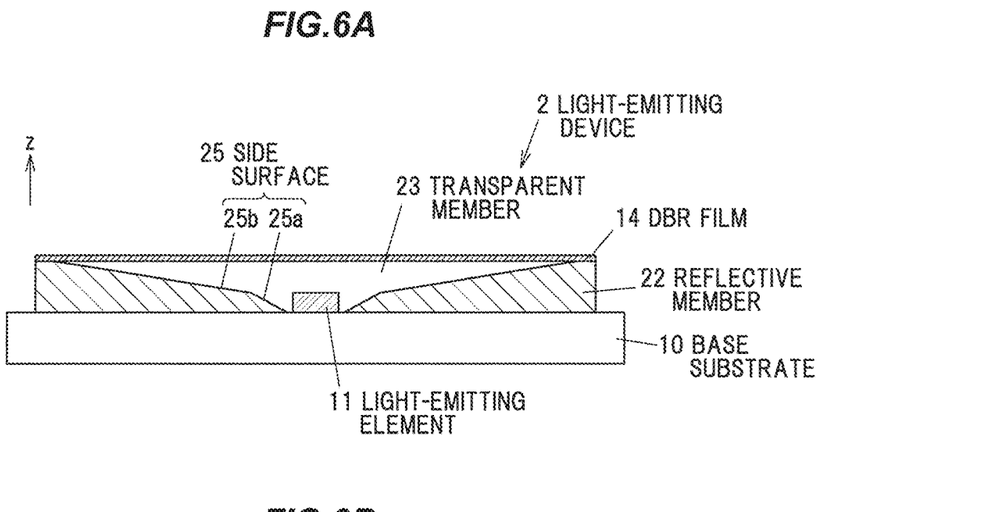
FIGS. 6A and 6B are respectively a vertical cross-sectional view and a perspective view showing a light-emitting device in the second embodiment.
Figure 6B:
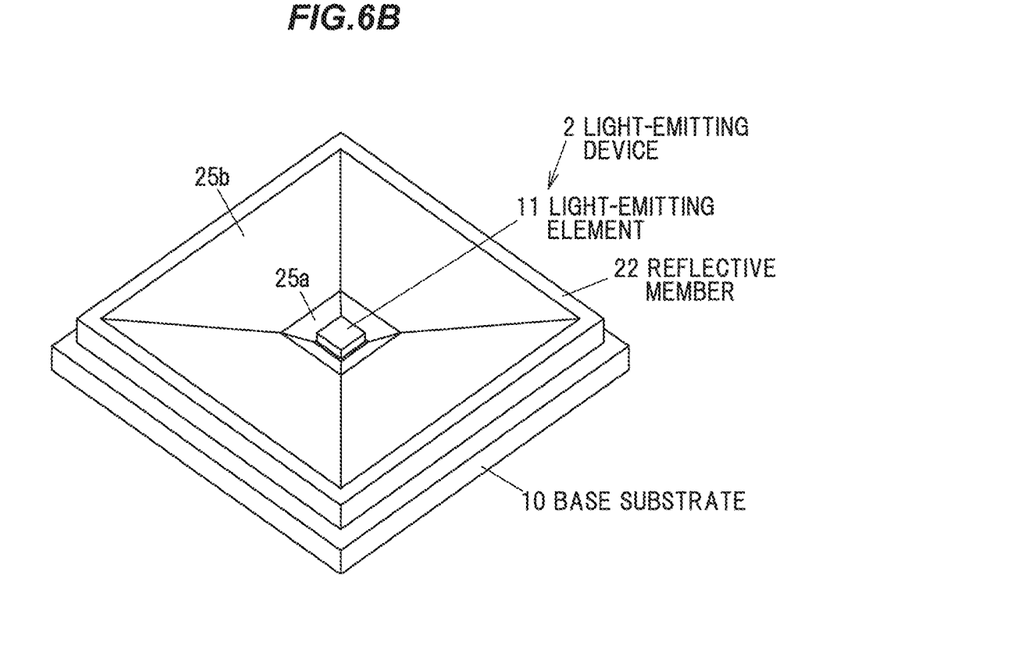

FIGS. 6A and 6B are respectively a vertical cross-sectional view and a perspective view showing a light-emitting device 2 in the second embodiment. A transparent member 23 (described later) and the DBR film 14 are not shown in FIG. 6B.

The light-emitting device 2 is provided with the base substrate 10, the light-emitting element 11 mounted on the base substrate 10, a reflective member 22 which is formed on the base substrate 10 and surrounds the light-emitting element 11, a transparent member 23 which has a flat upper surface and is placed to cover above the light-emitting element 11, and the DBR film 14 placed on the upper surface of the transparent member 23.

The reflective member 22 is formed of the same material as the reflective member 12 of the light-emitting device 1 in the first embodiment. An inner side surface 25 of the reflective member 22 is inclined so that a space inside the reflective member 22 is widened upward. Since this prevents multiple reflection inside the light-emitting device 2 and reduces losses, it is possible to improve light extraction efficiency.

In the example shown in FIGS. 6A and 6B, the inner side surface 25 of the reflective member 22 has a first inclined surface 25a inclined at a first angle with respect to the upper surface of the base substrate 10, and a second inclined surface 25b inclined at a second angle, which is smaller than the first angle, with respect to the upper surface of the base substrate 10 and located on the upper side of the first inclined surface 25a. The first angle of the first inclined surface 25a and the second angle of the second inclined surface 25b are respectively, e.g., 25°-35° and 5°-15°. The inner side surface 25 of the reflective member 22 can be composed of plural surfaces having different inclination angles as described above, or a curved surface, if required, to improve light extraction efficiency.

The transparent member 23 is formed of the same material as the transparent member 13 of the light-emitting device 1 in the first embodiment. The transparent member 23 fills the space inside the reflective member 22 and covers the upper and side surfaces of the light-emitting element 11.

The transparent member 23 may additionally contain a phosphor which is excited by light emitted from the light-emitting element 11 and emits fluorescence. In this case, the DBR film 14 is designed by taking into account both the emission wavelength of the light-emitting element 11 and the fluorescence wavelength of the phosphor.

In the light-emitting device 2 of the second embodiment, the entire side surfaces of the transparent member 23 are covered with the reflective member 22. Thus, light extracted from the light-emitting device 2 in a direction orthogonal to the axial direction z can be reduced to substantially zero.

Figure 7:
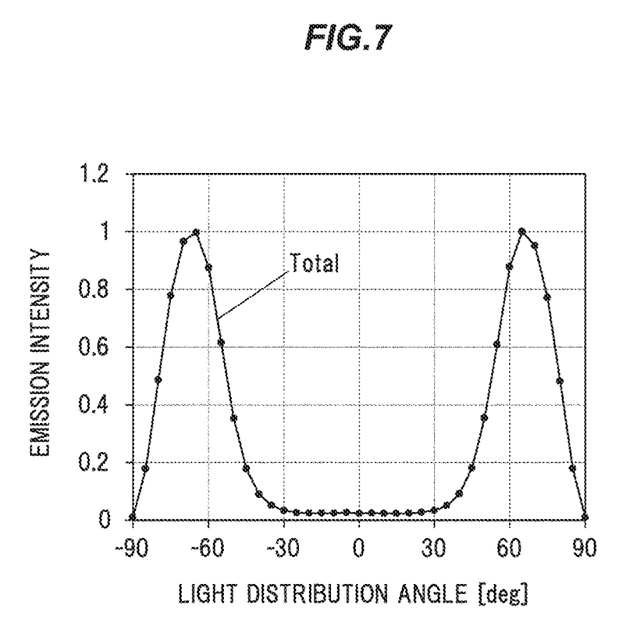
FIG. 7 is a graph showing a relation between light distribution angle and emission intensity of the light-emitting device in the second embodiment.

FIG. 7 is a graph showing a relation between light distribution angle and emission intensity of the light-emitting device 2. Since the light extracted from the light-emitting device 2 in a direction orthogonal to the axial direction z is substantially zero as described above, light having light distribution characteristics corresponding to "Side" in FIG. 3A, which is seen in light distribution characteristics of the light-emitting device 1 in the first embodiment, does not exist. Thus, light distribution characteristics of "Top" is light distribution characteristics of "Total".

Figure 8:
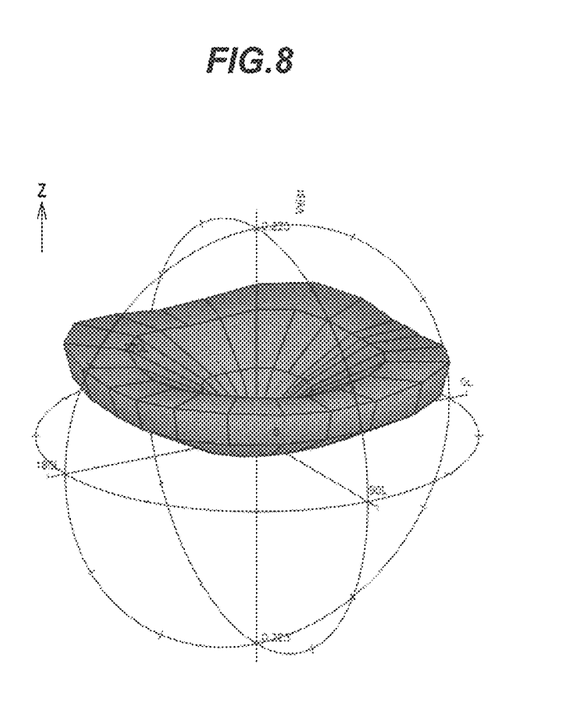
FIG. 8 is a diagram three-dimensionally illustrating a relation between light distribution angle and emission intensity of the light-emitting device in the second embodiment.

FIG. 8 is a diagram three-dimensionally illustrating a relation between light distribution angle and emission intensity (corresponding to "Total" in FIG. 7) of the light-emitting device 2. The origin of the coordinates showing the light distribution angle in FIG. 8 is the center of a light extraction surface of the light-emitting device 2 (the center of the upper surface of the DBR film 14).

As shown in FIGS. 7 and 8, the light-emitting device 2 has batwing light distribution characteristics in the same manner as the light-emitting device 1 in the first embodiment. In detail, in the relation between the light distribution angle and the emission intensity, the emission intensity peak exists in a range where the absolute value of the light distribution angle is greater than 0°. In addition, the emission intensity at 0° is preferably as low as possible, and is preferably, e.g., not more than 20%, more preferably not more than 10%, of the emission intensity at the peak (the peak emission intensity).

In the example shown in FIG. 7, the emission intensity of "Total" in a direction with a light distribution angle of 0° is 2.4% of the peak emission intensity. As such, in the light-emitting device 2 of the second embodiment, the emission intensity in a direction with a light distribution angle of 0° can be kept down to not more than 5% of the peak emission intensity. The emission intensity in a direction with a light distribution angle of 0° is kept down so low because not only light emitted from the upper surface of the light-emitting element 11 but also substantially all the light emitted from the side surfaces of the light-emitting element 11 are extracted through the DBR film 14.

In addition, since all the light emitted from the light-emitting element 11 is extracted through the DBR film 14, the emission intensity at a light distribution angle of 90° in absolute value is zero in the relation between the light distribution angle and the emission intensity of the light-emitting device 2.

Even when having another structure (e.g., a structure in which side surfaces of the transparent member 13 of the light-emitting device 1 in the first embodiment may be all covered with a reflective member), the emission intensity in a direction with a light distribution angle of 90° in absolute value can be reduced to zero as long as it is a structure in which all side surfaces of the transparent member are covered with the reflective member.

Method for Manufacturing the Light-Emitting Device

FIGS. 9A to 9D are vertical cross-sectional views showing an example of a process for manufacturing the light-emitting device 2 in the second embodiment.

Figure 9A:
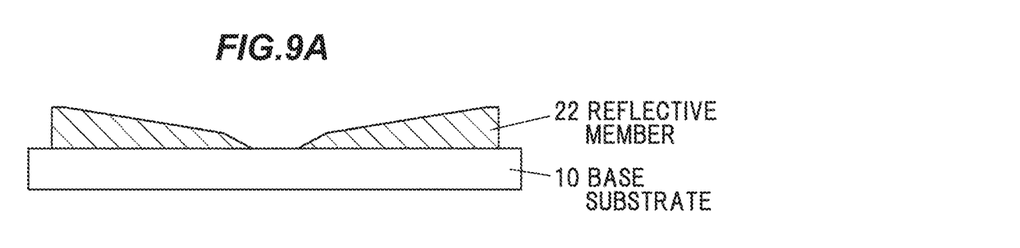
FIGS. 9A to 9D are vertical cross-sectional views showing an example of a process for manufacturing the light-emitting device in the second embodiment.

Firstly, as shown in FIG. 9A, the reflective member 22 is formed on the base substrate 10. The reflective member 22 can be formed by, e.g., injection molding of a resin, such as silicone-based resin or epoxy-based resin, containing white pigment such as titanium dioxide.

Figure 9B:
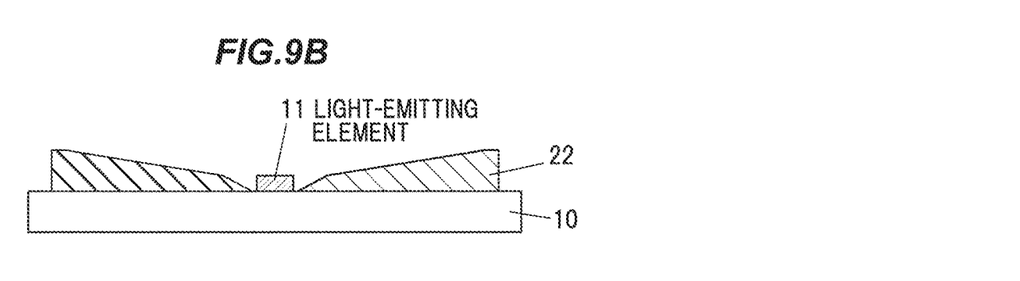

Next, as shown in FIG. 9B, the light-emitting element 11 is mounted on the base substrate 10 in a region surrounded by the reflective member 22. Formation of the reflective member 22 and the mounting of the light-emitting element 11 may be performed in the reverse order.

Figure 9C:
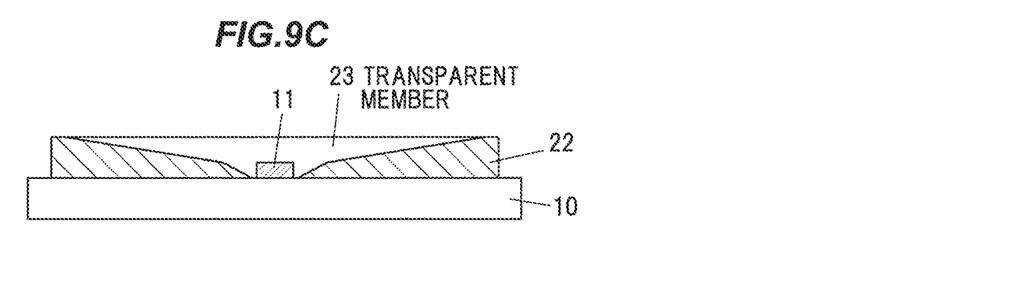

Next, as shown in FIG. 9C, the transparent member 23 is provided to fill the space inside the reflective member 22 so that the upper and side surfaces of the light-emitting element 11 are covered. The transparent member 23 can be formed by, e.g., injecting a resin such as silicone-based resin or epoxy-based resin, using a drop method. At this stage, the upper surface of the transparent member 23 is preferably flattened by polishing using a grinder, etc., so that the DBR film 14 can be flatly placed in tight contact with the upper surface of the transparent member 23.

Figure 9D:
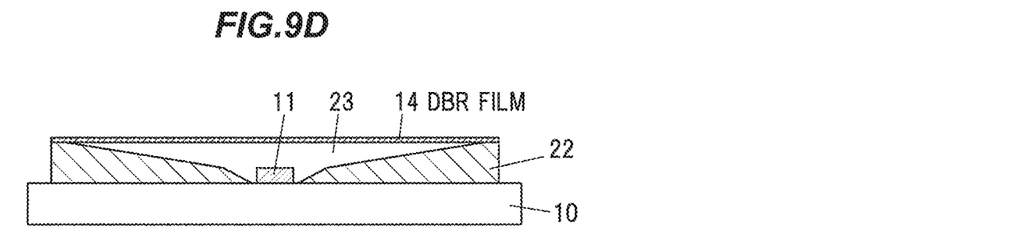

Next, as shown in FIG. 9D, the DBR film 14 is placed on the flat upper surface of the transparent member 23. The DBR film 14 can be formed by, e.g., alternately depositing thin films of $TiO_2$ and $SiO_2$.

Third Embodiment

The third embodiment is different from the second embodiment in the shape of the reflective member. The explanation of the same features as those in the second embodiment will be omitted or simplified.

Configuration of a Light-Emitting Device

Figure 10A:
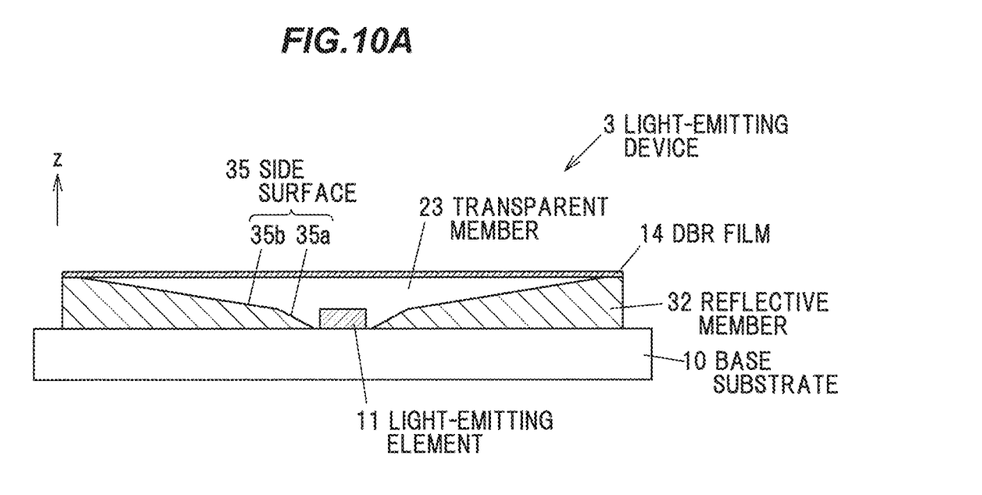
FIGS. 10A and 10B are respectively a vertical cross-sectional view and a perspective view showing a light-emitting device in the third embodiment.
Figure 10B:
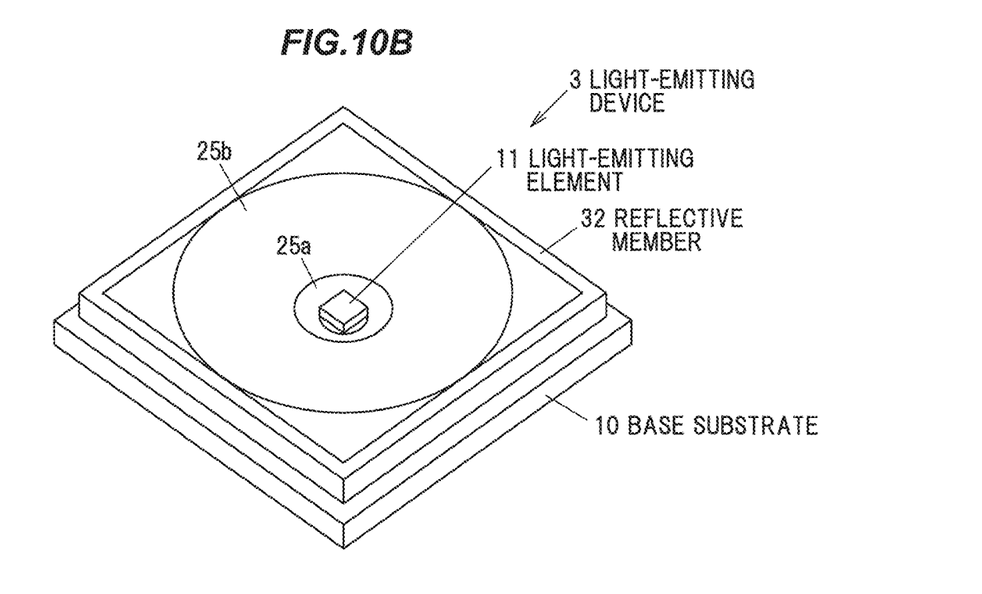

FIGS. 10A and 10B are respectively a vertical cross-sectional view and a perspective view showing a light-emitting device 3 in the third embodiment. The transparent member 23 and the DBR film 14 are not shown in FIG. 10B.

The light-emitting device 3 is provided with the base substrate 10, the light-emitting element 11 mounted on the base substrate 10, a reflective member 32 which is formed on the base substrate 10 and surrounds the light-emitting element 11, the transparent member 23 which has a flat upper surface and is placed to cover above the light-emitting element 11, and the DBR film 14 placed on the upper surface of the transparent member 23.

The reflective member 32 is formed of the same material as the reflective member 22 of the light-emitting device 2 in the second embodiment. An inner side surface 35 of the reflective member 32 is also inclined so that a space inside the reflective member 32 is widened upward in the same manner as the reflective member 22. However, the inner side surface 35 of the reflective member 32 is an inverted truncated cone-shaped side surface, while the inner side surface 25 of the reflective member 22 is an inverted truncated pyramid-shaped side surface (in the example shown in FIG. 6, the first inclined surface 25a and the second inclined surface 25b form respectively different inverted truncated pyramid shapes).

In addition, the inner side surface 35 of the reflective member 32 preferably has a first inclined surface 35a inclined at a first angle with respect to the upper surface of the base substrate 10, and a second inclined surface 35b inclined at a second angle, which is smaller than the first angle, with respect to the upper surface of the base substrate 10 and located on the upper side of the first inclined surface 35a, in the same manner as the reflective member 22. In this case, the first inclined surface 35a and the second inclined surface 35b form respectively different inverted truncated cone shapes. The first angle of the first inclined surface 35a and the second angle of the second inclined surface 35b can be respectively the same as the first angle of the first inclined surface 25a and the second angle of the second inclined surface 25b of the reflective member 22.

In the light-emitting device 3 of the third embodiment, the entire side surface of the transparent member 23 is covered with the reflective member 32 in the same manner as the light-emitting device 2 of the second embodiment. Thus, light extracted from the light-emitting device 3 in a direction orthogonal to the axial direction z can be reduced to substantially zero.

Figure 11:
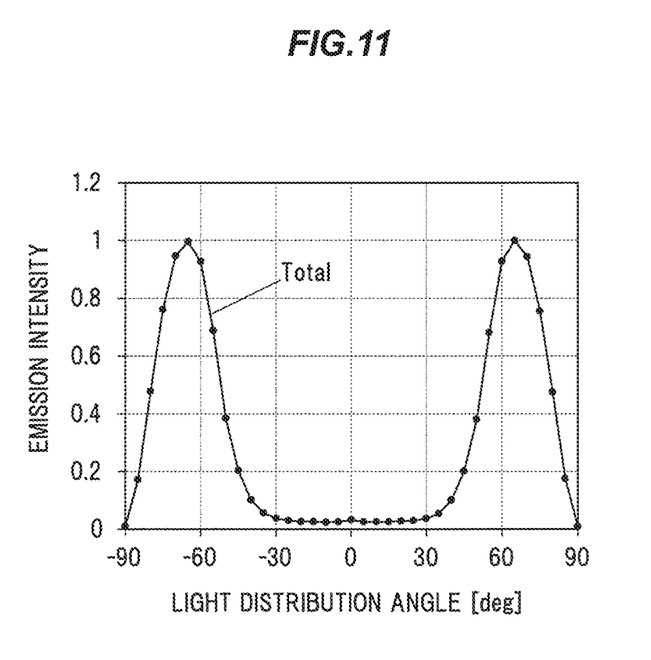
FIG. 11 is a graph showing a relation between light distribution angle and emission intensity of the light-emitting device in the third embodiment.

FIG. 11 is a graph showing a relation between light distribution angle and emission intensity of the light-emitting device 3. Since the light extracted from the light-emitting device 3 in a direction orthogonal to the axial direction z is substantially zero as described above, light having light distribution characteristics corresponding to "Side" in FIG. 3A, which is seen in light distribution characteristics of the light-emitting device 1 in the first embodiment, does not exist. Thus, light distribution characteristics of "Top" is light distribution characteristics of "Total".

Figure 12:
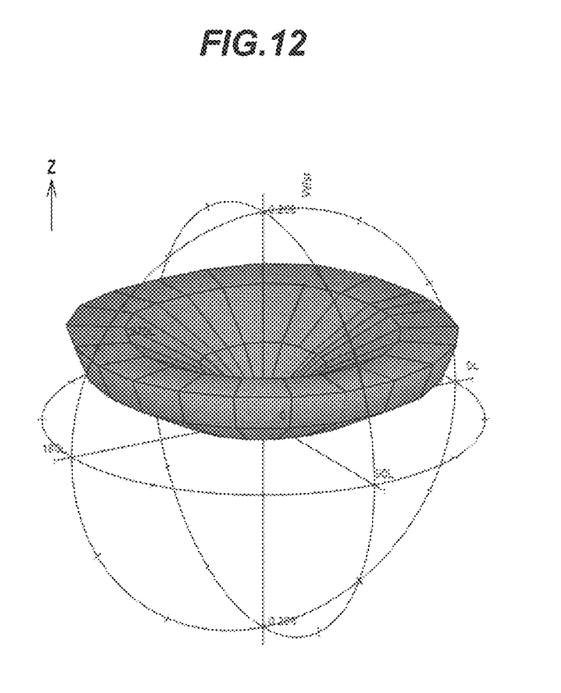
FIG. 12 is a diagram three-dimensionally illustrating a relation between light distribution angle and emission intensity of the light-emitting device in the third embodiment.

FIG. 12 is a diagram three-dimensionally illustrating a relation between light distribution angle and emission intensity (corresponding to "Total" in FIG. 11) of the light-emitting device 3. The origin of the coordinates showing the light distribution angle in FIG. 12 is the center of a light extraction surface of the light-emitting device 3 (the center of the upper surface of the DBR film 14).

As shown in FIGS. 11 and 12, the light-emitting device 3 has batwing light distribution characteristics in the same manner as the light-emitting device 1 in the first embodiment and the light-emitting device 2 in the second embodiment. In detail, in the relation between the light distribution angle and the emission intensity, the emission intensity peak exists in a range where the absolute value of the light distribution angle is greater than 0°. The emission intensity at 0° is preferably, e.g., not more than 20%, more preferably not more than 10%, of the emission intensity at the peak (the peak emission intensity).

In the example shown in FIG. 11, the emission intensity of "Total" in a direction with a light distribution angle of 0° is 3.2% of the peak emission intensity. As such, in the light-emitting device 3 of the third embodiment, the emission intensity in a direction with a light distribution angle of 0° can be kept down to not more than 5% of the peak emission intensity. The emission intensity in a direction with a light distribution angle of 0° is kept down so low because not only light emitted from the upper surface of the light-emitting element 11 but also substantially all the light emitted from the side surfaces of the light-emitting element 11 are extracted through the DBR film 14.

In addition, since all the light emitted from the light-emitting element 11 is extracted through the DBR film 14 in the same manner as the light-emitting device 2 in the second embodiment, the emission intensity at a light distribution angle of 90° in absolute value is zero in the relation between the light distribution angle and the emission intensity of the light-emitting device 3.

In addition, as shown in FIG. 12, dependence of light distribution characteristics of the light-emitting device 3 on the angle in the horizontal plane (a plane orthogonal to the axial direction z) is smaller than dependence of light distribution characteristics of the light-emitting device 2 on the angle in the horizontal plane. This results from the configuration in which the inner side surface 35 of the reflective member 32 is an inverted truncated cone-shaped side surface.

The light-emitting device 3 can be manufactured by the same process as for manufacturing the light-emitting device 2 in the second embodiment.

Effects of the Embodiments

According to the first to third embodiments, it is possible to provide light-emitting devices which have ideal batwing light distribution characteristics with low axial luminous intensity. In addition, since these light-emitting devices do not use a secondary lens to realize batwing light distribution characteristics, it is possible to reduce the device size and also possible to reduce the manufacturing cost.

Although the embodiments of the invention have been described, the invention is not intended to be limited to the embodiments, and the various kinds of modifications can be implemented without departing from the gist of the invention. In addition, the constituent elements in the embodiments can be arbitrarily combined without departing from the gist of the invention.

In addition, the invention according to claims is not to be limited to the embodiments. Further, please note that all combinations of the features described in the embodiments are not necessary to solve the problem of the invention.

What is claimed is:
1. A light-emitting device, comprising:
  a light-emitting element mounted on a base substrate;
  a reflective member that is formed on the base substrate and surrounds the light emitting element;
  a transparent member that has a flat upper surface and is placed to cover above the light-emitting element; and
  a distributed Bragg reflector (DBR) film placed on the upper surface of the transparent member,
  wherein the reflective member covers side surfaces of the light-emitting element,
  wherein the transparent member comprises a first portion covering the upper surface of the light-emitting element and a second portion having a plate shape and placed on the upper surface of the first portion and the upper surface of the reflective member, and
  wherein the reflective member covers side surfaces of the first portion.
2. The light-emitting device according to claim 1, wherein a relation between a light distribution angle and an emission intensity is obtained such that the emission intensity at a light distribution angle of 0° is not more than 10% of a peak of the emission intensity.

3. The light-emitting device according to claim 1, wherein all side surfaces of the transparent member are covered with the reflective member.

4. The light-emitting device according to claim 3, wherein an inner side surface of the reflective member is inclined so that a space inside the reflective member is widened upward, and
wherein the transparent member fills the space inside the reflective member and covers the upper and side surfaces of the light-emitting element.

5. The light-emitting device according to claim 4, wherein the inner side surface of the reflective member comprises an inverted truncated cone-shaped side surface.

6. The light-emitting device according to claim 5, wherein the inner side surface of the reflective member comprises an inverted truncated pyramid-shaped side surface.

7. The light-emitting device according to claim 4, wherein the inner side surface of the reflective member includes plural surfaces having different inclination angles.

8. The light-emitting device according to claim 4, wherein the inner side surface of the reflective member includes a curved surface.

9. The light-emitting device according to claim 4, wherein the inner side surface of the reflective member includes a first inclined surface and a second inclined surface that form respectively different inverted truncated pyramid shapes.

10. The light-emitting device according to claim 4, wherein the inner side surface of the reflective member comprises a first inclined surface inclined at a first angle with respect to the upper surface of the base substrate and a second inclined surface inclined at a second angle with respect to the upper surface of the base substrate and located on the upper side of the first inclined surface, the second angle being smaller than the first angle.

11. The light-emitting device according to claim 10, wherein the first angle of the first inclined surface is in a range of 25°-35°.

12. The light-emitting device according to claim 10, wherein the second angle of the second inclined surface is in a range of 5°-15°.

13. The light-emitting device according to claim 11, wherein the second angle of the second inclined surface is in a range of 5°-15°.

14. The light-emitting device according to claim 3, wherein a relation between a light distribution angle and an emission intensity is obtained such that the emission intensity at a light distribution angle of 0° is not more than 5% of a peak of the emission intensity.

15. The light-emitting device according to claim 1, wherein the transmittance of light to pass through the DBR at 0° is not more than 20% of a peak of the transmittance.

16. The light-emitting device according to claim 15, wherein the transmittance of the light to pass through the DBR at 0° is not more than 10% of the peak transmittance.

* * * * *